United States Patent [19]

Vilaprinyo Oliva

[11] 4,215,170

[45] * Jul. 29, 1980

[54] METALLIZATION PROCESS

[75] Inventor: D. Entique Vilaprinyo Oliva, Barcelona, Spain

[73] Assignee: Eurographics Holding, N. V., Curacao, Netherlands Antilles

[ * ] Notice: The portion of the term of this patent subsequent to May 8, 1996, has been disclaimed.

[21] Appl. No.: 882,162

[22] Filed: Feb. 28, 1978

Related U.S. Application Data

[63] Continuation-in-part of Ser. No. 640,392, Dec. 12, 1975.

[51] Int. Cl.² ........................ B44C 1/10; B32B 31/12; B32B 15/02

[52] U.S. Cl. .................... 428/328; 428/208; 428/209; 428/457; 428/458; 428/461; 428/463; 428/464; 156/230; 156/233; 156/234; 156/241; 427/147; 428/914; 428/423.1; 428/425.1; 428/425.8

[58] Field of Search .............. 428/914, 425, 208, 209, 428/328, 457, 458, 461, 463, 464, 424; 156/230, 233, 234, 241; 427/147

[56] References Cited

U.S. PATENT DOCUMENTS

| | | | |
|---|---|---|---|
| 1,124,869 | 1/1915 | Davis | 428/914 |
| 2,703,772 | 3/1955 | Keithly | 428/914 |
| 2,969,300 | 1/1961 | Franz | 428/914 |
| 3,235,395 | 2/1966 | Scharf | 156/230 |
| 3,458,376 | 7/1969 | Malik | 428/914 |
| 3,660,190 | 5/1972 | Stroszynski | 428/914 |
| 3,730,752 | 5/1973 | Garza | 428/914 |
| 3,753,850 | 8/1973 | Brunet | 428/914 |
| 3,910,806 | 10/1975 | Schwartz | 156/230 |
| 3,949,139 | 4/1976 | Dunning | 428/914 |
| 3,961,121 | 6/1976 | Warsager | 428/914 |
| 3,989,609 | 11/1976 | Brack | 428/914 |
| 4,012,552 | 3/1977 | Watts | 428/914 |

FOREIGN PATENT DOCUMENTS 722400 1/1955 United Kingdom .

Primary Examiner—Ellis P. Robinson

[57] ABSTRACT

A process for the metallization of a substrate and the product formed thereby. An extremely thin (substantially less than the wavelength of light) coat of metallic particles is deposited on a transfer agent. A thin coat of varnish is applied to either the substrate or the transfer agent, the substrate and the transfer agent are laminated together and the varnish is cured. The metallic particles will become absorbed within the varnish and the substrate and transfer agent are then separated. The substrate is provided with a highly polished specular metallic finish.

17 Claims, 9 Drawing Figures

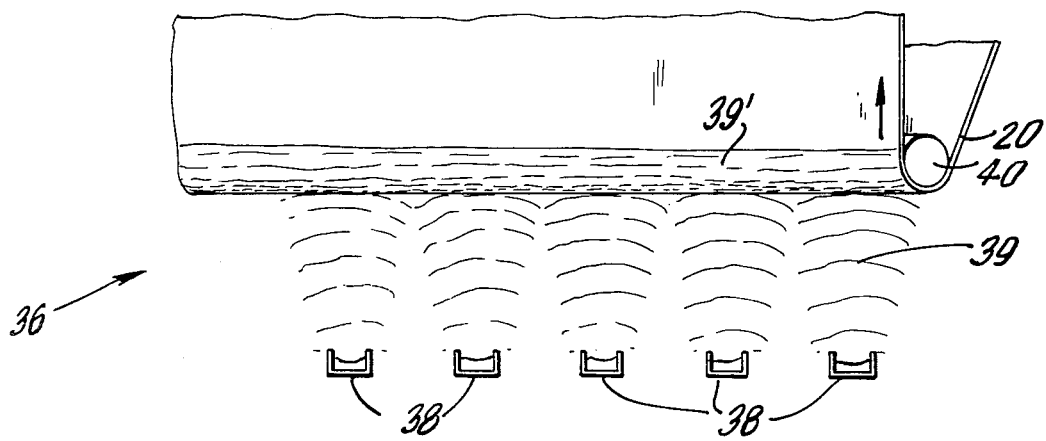
FIG.2
FIG.3A
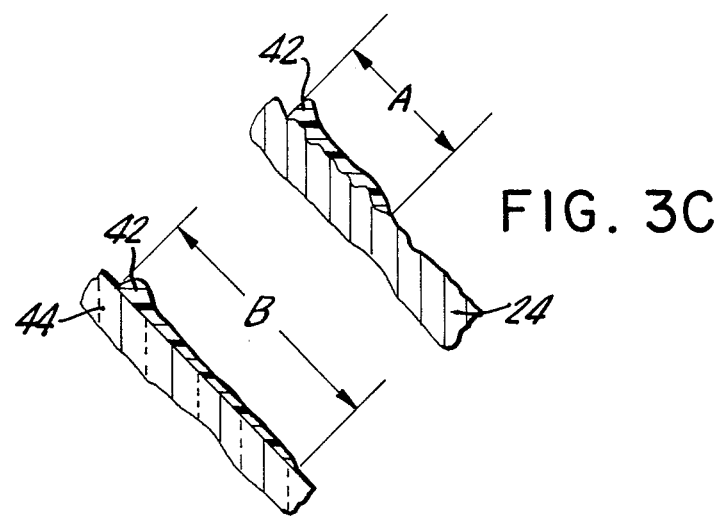
FIG. 3C
FIG.3B

METALLIZATION PROCESS

This application is a continuation-in-part of copending application U.S. Ser. No. 640,392, filed Dec. 12, 1975, which is incorporated herein by reference.

BACKGROUND OF THE INVENTION

This invention relates generally to a process for the specular metallization of a substrate and the article produced thereby. The substrate may be in web or sheet form and may consist of paper, cardboard, wood, plastic and many other substances. A highly glossy, smooth, polished specular metal appearance is conferred to the substrate without the necessity for the substrate to be specially treated, or polished.

In the art, various processes are known for the metallization of a substrate surface in web and sheet form. One process involves the lamination of a metal foil to a substrate by the use of solvent based or polymerizable adhesives. This process is commonly used for the metallization of flexible materials and the most common metal used is aluminum foil. The process requires that the metal foil be of a thickness of more than 1 micron. The use of thinner foils is not possible on a mass production basis and is only possible in small batch production. In order to obtain a specular finish, the metal foil must have a polished finish. The gloss and finish of the final product do not depend on the substrate but rather, on the gloss and finish given to the foil.

Another known process consists of the dispersion of extremely fine metal powder in a binder and a spreading of the binder containing of the powder over the surface to be metallized. Further metallization processes are carried out by chemical precipitation and electrolytic means. In these processes, the gloss and finish of the metallized surface depend on the gloss and finish of the substrate. A high gloss and specular finish is obtained when the substrate materials are glossy, such as a plastic film or a polished surface. Where the substrate is not smooth, a smooth finish will not be obtained. Accordingly, in these processes the gloss and finish depend on the finish of the substrate rather than the metal used.

A further commonly used process is vacuum metallization, in which vaporized metal is condensed on the substrate to be metallized. This requires that the substrate be placed in a chamber under a high vacuum of the order of $10^{-3}$ $10^{-4}$ torr. Clearly, this process is restricted to materials which will not degas or contain volatile substances such as moisture, plasticizers and resins. A disadvantage of this process is that the resulting surface is generally fairly rough since the vaporized metal does not even out the roughness of the surface onto which it is condensed. To improve the finish of a substrate such as paper, it is necessary to pre-polish or pre-varnish the paper substrate. In certain instances, even pre-treatment is insufficient to produce a specular surface and a further step of calendaring the substrate surface at a high temperature is necessary. This extra step considerably increases the cost of the finished product.

Furthermore, when this process is utilized with materials that substantially degas, such as paper and cardboards, vacuum metallization equipment capable of attaining a high vacuum is necessary to overcome the loss of vacuum in the chamber caused by the air and moisture contained in the paper or board. In some instances, degasing of the material may be required prior to metallization.

The instant process and article produced thereby are directed to providing a smooth specular surface that is independent of the smoothness of the substrate or the metal, without the need for pretreatment of the substrate and without exposing the substrate to a vacuum.

SUMMARY OF THE INVENTION

Generally speaking, in accordance with the invention, a process for metallization of a substrate and the product formed thereby are provided. In carrying out the invention an extremely thin coat of metallic particles is deposited on a finely finished transfer agent. A thin coat of varnish is applied to either the substrate or transfer agent. The transfer agent and the substrate are laminated together before the varnish has cured. The metallic particles will become absorbed or embedded within the varnish coat, which will provide the substrate with the appearance of a specular metallic finish. After the varnish has cured, the transfer agent and substrate are separated. The transfer agent may be reused in subsequent processes.

Accordingly, it is an object of this invention to provide a substrate with a metallic coating that is substantially thinner and of markedly lower weight than a lamination with metallic foil, so as to provide a larger yield of coated substrate from the metal and significantly reduce the cost of material.

It is a further object of this invention to provide a process for the production of a metallic coated substrate that has a specular gloss equivalent to that of metallic foil and at economies substantially less than that of foil laminates.

Another object of this invention is to provide a metallic coated substrate having a chemical resistance approaching that of metallic foil that does not yellow or change in appearance with the passsage of time; that is abrasion resistant, flexible and hard so as to withstand various production and printing processes, and that can be printed upon.

A further object of this invention is to provide a metallic coated substrate that is infra-red reflective and a barrier to visible and ultra violet radiation so as to be suitable for the packaging of foods; that, like foil, is relatively impermeable; and that can be produced in line with printing machinery.

Another object of this invention is to provide a varnish and metallic coated substrate which is crack resistant upon bending.

Still other objects of this invention will become apparent upon a reading of the detailed specification to follow.

BRIEF DESCRIPTION OF THE DRAWINGS

For a better understanding of the invention, reference is made to the following drawings, taken in connection with the specification, in which:

FIG. 2 illustrates the apparatus for the vacuum deposition of the metal particles on the transfer agent;

FIGS. 3A to 3C illustrate the use of the varnish for levelling the surface of the substrate and the method for determining the amount of varnish to be used;

DESCRIPTION OF THE PREFERRED EMBODIMENTS

Figure 1:
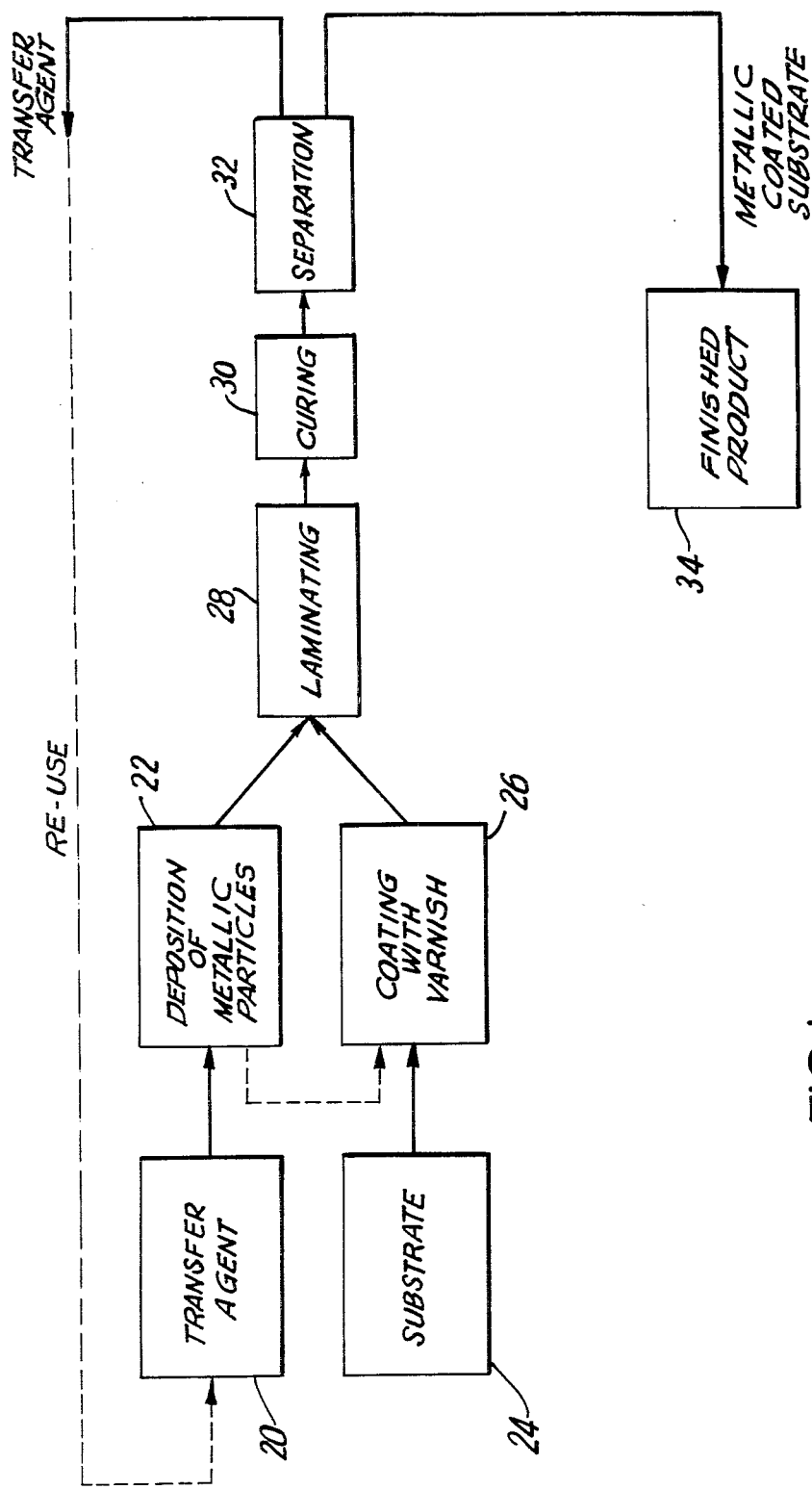
FIG. 1 is a flow diagram of the process of metallization of the substrate in accordance with the invention.

FIG. 1 of the drawings illustrates the process for the production of a metallic coated substrate in accordance with the instant invention. A transfer agent 20 that has a glossy, polished surface will be metallized. The transfer agent must be finely finished since it will impart the final surface to the product. It must also have an adherence to the metal particles less than that of the varnish to be employed. Suitable materials for the transfer agent 20 are untreated polypropylene, polyester, polyethylene, polyvinylchloride, polyamide, co-extrusates and regenerated cellulose, among others. Transfer agent 20 is then metallized at 22 by the deposition of metallic particles by any known process such as vacuum metallization, chemical precipitation and other coating techniques. Suitable metals for deposition are aluminum, copper, silver, nickel, tin, platinum, gold, their alloys and other vaporizable metals. The quantity of metal deposition will be monitored so that the metal particles deposited will build to an extremely thin layer. The deposited particles will have a thickness of substantially less than the wavelength of light, e.g. less than 1000 and preferably less than about 500 Angstroms, and a spacing (where such spacing or metal film aperatures occur by virtue of the layer thinness) substantially less than that of the wavelength of visible light. Accordingly, the light is substantially reflected from the metallic surface and the metallic surface appears continuous and exhibits a fully specular metallic surface.

While transfer agent 20 undergoes the step of metallic deposition at 22, a substrate 24 is prepared (these steps need not be contemporaneous). The substrate, which will eventually be coated with the metallic particles, may be in web or sheet form and have a rough or smooth surface. Suitable substrates are paper, cardboard, wood, leather, plastic and in fact any sheeting material capable of being varnish coated. Substrate 24 is coated with a thin coat of varnish at 26. A suitable varnish for this step is polyurethane varnish. The varnish serves both as a vehicle for producing, in conjunction with the transfer agent, a smooth, specular surface, and an adhesive which transfers the metallic particles deposited in step 22 from transfer agent 20 to substrate 24 and absorbs them into the varnish. The varnish also serves to level and smooth the surface of the substrate 24. It is a feature of this invention that while the varnish will adhere to the substrate, it will not adhere to transfer agent 20.

Alternatively, the coating of varnish may be applied over the metal particles deposited on transfer agent 20. This alternative procedure produces a finished product which is substantially identical to that produced when substrate 20 is varnished, although empirically depending on the varnish and substrate, one or the other will prove preferable. This alternative procedure is illustrated in FIG. 1 as the flow line leading from step 22 to step 26.

After step 22, the deposition of the metallic particles on transfer agent 20, and coating 26 of substrate 24 or transfer agent 20, a laminating step 28 will take place. Step 28 will take place before the varnish has had a chance to cure. In laminating step 28, substrate 24 is brought into contact with the metallic coated surface of transfer agent 20. This is preferably accomplished by rolling substrate 24 and transfer agent 20 into a single roll under slight pressure. This step is similar to a conventional lamination process. The varnish will transfer the metallic particles from the transfer agent 20 to substrate 24. The varnish will absorb the metallic particles and will take on the smooth surface characteristics of the transfer agent 20 once it is removed.

The laminated substrate 24 and transfer agent 20 may be cured at 30 by air drying or conventional curing processes. Once the varnish has set, dried or polymerized, it does not bond to transfer agent 20, but bonds strongly to substrate 24. Curing step 30 may be natural or accelerated by heat or exposure to radiation. After curing at 30, the separation step 32 will take place. Transfer agent 20 and substrate 24 may be separated (where flexible webs) onto two separate rollers and at this point the varnish and its absorbed or embedded metallic particles will have adhered to substrate 24. After separation at 32, transfer agent 24 may be re-used a large number of times, thereby rendering extraordinary economic advantages.

The finished product 34 will consist of substrate 24 which will have a smooth, specular, metallic coating which will appear as continuous and smooth, because any interstices or spaces between the metallic particles permit little light transmission (i.e., less than 30%, preferably less than 20%). The varnish need not be spread over the entire surface of substrate 24 but rather can be distributed on only certain portions in various patterns. Thus, only certain portions of substrate 24 will have a metallic gloss. The finished product 34 may be subjected to various other processes such as cutting, embossing, die-stamping, slitting and printing on the metallized surface with various printing systems such as offset, rotogravure, flexographic, silk screen and others.

While the above sets forth the various steps and inter-relationship of steps of the process for the production of the metallic coated substrate, the apparatus and processes of each individual step will now be described in greater detail.

FIG. 2 diagramatically illustrates a preferred embodiment for carrying out step 22, the deposition of metallic particles upon the transfer agent 20. The most efficient form of production of metallic coated surfaces occurs when transfer agent 20 is in the form of an elongated web of material which may be fed by roller means. Transfer agent 20 is fed into a conventional vacuum chamber 36; within vacuum chamber 36 are a number of reservoirs 38 of the metal (e.g. aluminum) to be deposited upon substrate 20. The reservoir number is sufficient to provide a uniform coating (e.g. 10 reservoirs one cm. wide by 7.5 cms. long for a 75 cm. wide web). Each reservoir 38 is heated to a liquifying temperature (e.g. 1500° C. for All), and the web is maintained at room temperature by a water cooled roller 40, passing approximately 15 cm. above the reservoirs. As transfer agent 20 passes through vacuum chamber 36, metal vapor 39 given off by the liquid metal will migrate to transfer agent 20 and condense there 39' due to the temperature differential. The speed of the web of transfer agent 20 may be continuously adjusted as may the temperature of the reservoirs so that the metal deposited therein by condensation will have a thickness of preferably less than about 500 Angstroms on substrate 20. This extremely small film thickness (depth) permits the minimal use of metallic material, yet upon conclusion of the process gives the appearance of a completely metallized continuous metal surface because of the varnish finish. The control over the vacuum deposition process may be by suitable electronic or mechanical means, such that the rate of deposition is continually monitored and fed back to control the various heating electrodes and rate of feed of the web transfer agent 20.

FIGS. 3A and 3B illustrate the varnish coating step 26. As noted previously, substrate 24 can be of any suitable material which may have either a rough or smooth surface. Pre-conditioning is not required since the coating of varnish will provide for a uniform specular smooth coating on all types of surfaces, and will fill whatever voids exist on the surface of substrate 24. This is demonstrated in FIG. 3A, in which a substrate 24 has been coated with a varnish 42, which has completely smoothed out the irregular surface of substrate 24. FIGS. 3B and 3C illustrate a method of determining of the amount of varnish needed to provide a smooth coating to substrate 24. Generally speaking, the rougher or more absorbent the surface of substrate 24, the greater amount of varnish 42 will be required. The amount required is determined empirically by taking a test sample of substrate 24, placing it an angle and then applying a drop of varnish 42 on angled substrate 24 and measuring the length of the run-off, such as distance A shown. A similar test is performed with a piece of glass 44 in place of substrate 24. The length of run-off B is then measured. From the known amounts of varnish 42 needed to properly coat glass 44, the amount of varnish 42 needed to coat substrate 24 may be determined. Varnish 42 may be coated on substrate 24 or transfer agent 20 by any known means but bath dipping has been found preferable. The varnish coat need only be just sufficient to fill the valleys and top the hills 24'.

Figure 4A:
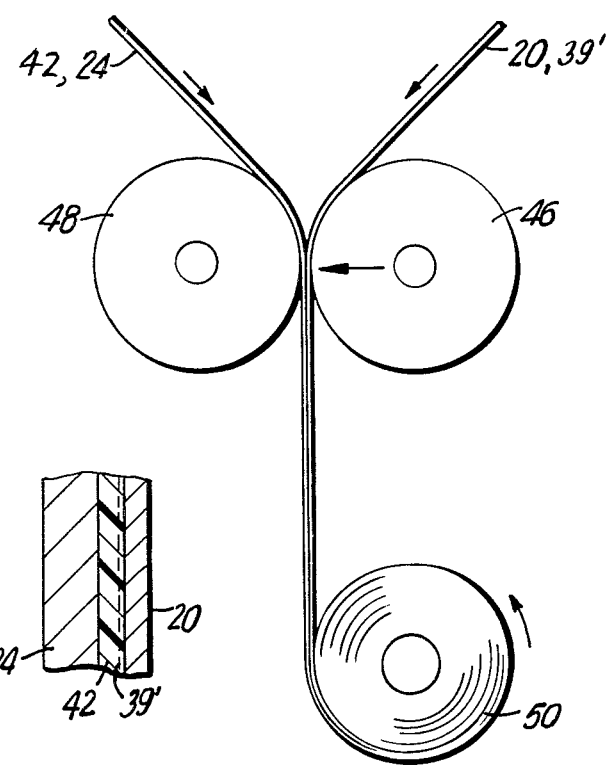
FIGS. 4A to 4C illustrate the lamination process and the relationship between the roller pressure and diameter.
Figure 4C:
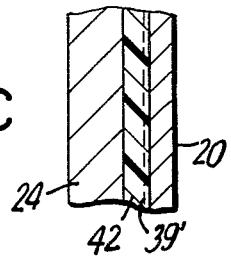
Figure 4B:
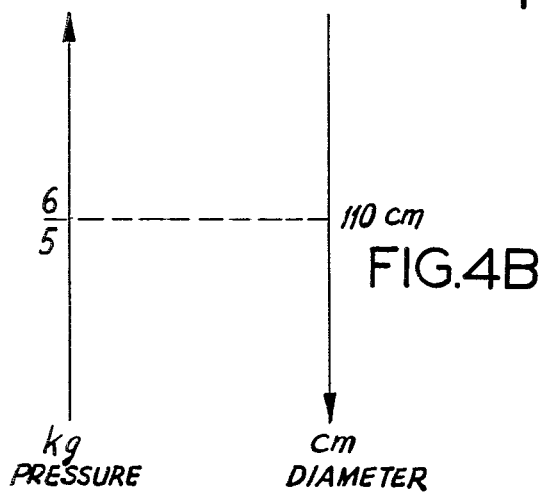
Figure 5:
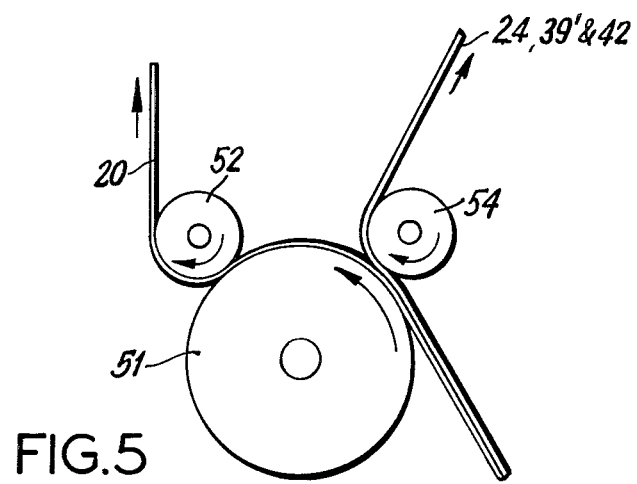
FIG. 5 illustrates the separation of the metallized substrate from the transfer agent.

FIGS. 4A and 4B illustrate the lamination of substrate 24 and metallically deposited transfer agent 20. The respective webs of substrate 24 and metallically deposited transfer agent 20 are brought together in face to face relationship between a pair of rollers 46, 48. Roller 46 is for example a rubber roller of approximately a 75 Shore hardness and Roller 48 may be a suitable hard roller, such as a chrome coated or stainless steel metal roller. A pressure is applied between rollers 46 and 48 to laminate substrate 24 to the metallically deposited transfer agent 20. The step of lamination is a continuous step after coating step 26 and depositing step 22, before varnish 42 has had a chance to cure or set. The pressure applied between rollers 46 and 48 is inversely proportional to the diameter of the rollers as shown in FIG. 4B. One pressure-diameter combination would be a pressure between 5 kg. and 6 kg. and a diameter of roller 46 of approximately 110 cm. After exiting rollers 46 and 48, substrate 24 and transfer agent 20 are wrapped around a take-up roller 50 which, after being wound, is set aside for curing.

Curing step 30 may take place in the rolled state in approximately 24 hours or the curing may be speeded up with the use of different varnished or the application of heat or exposure radiation. As noted above, as varnish 42 sets, the metallic particles 39' (see detail, FIG. 4C) deposited on transfer agent 20 will become completely trapped by varnish 42 on substrate 24. Significantly, varnish 42 will take on the smooth surface of transfer agent 20 and this is the key to the specular finish enjoyed by the process. However, no bonding whatsoever will take place between varnish 42 and transfer agent 20 and the transfer agent may be reused as many as 40 times, making the process extremely economical.

The separation 32 or delamination step will occur next. Roller 50 will be placed in contact with a pair of tangentially juxtaposed rollers 52, 54. Tangent roller 52 will strip off transfer agent 20 which will be found to be completely free of any of the metallic coating which will have been transferred to the varnish layer on substrate 24. Accordingly, tangent roller 54 will strip off substrate 24, 39', 42 which will have the metallic particles embedded within the varnish layer and which will have a smooth, specular metallic finish. After removal from roller 52, substrate 20 may be reused many times and the finished product may be taken from roller 54 to further processing, such as printing or cutting as noted above. There will only be a small amount of sticking between substrate 24 and transfer agent 20, as they are separated. The sticking force will be on the order of 5-10 grams per square centimeter and so long as it is less than the pulling force of the varnish used the functional requisites of process will be accomplished.

The following examples are given as illustrative of the process and product formed by said process. These examples are illustrative only, and are not to be construed in any limitng sense.

EXAMPLE 1

A 20 micron thick film of untreated polypropylene is used as the transfer agent and is vacuum metallized without any prior coating. An extremely fine layer of aluminum of the order of 0.03 grams per square meter is deposited on the film. This layer will deposit an extremely thin coating of aluminum, in the order of about 105 Angstroms on the surface of the polypropylene film transfer agent. Preferably the thickness range is 50-250 Angstroms. This process is effected in a continuous manner on a reel.

In this example, the coating of varnish may be applied to the metallic coating on the film transfer agent rather than the substrate itself. The varnish used in this case is a polyurethane type and, after coating, the film is permitted to evaporate (e.g. by passing over reels of rollers in an exhaust fan atmosphere) and is laminated to the substrate to be metallized. In this case, the substrate is a paper of a weight of approximately 80 grams per square meter. The lamination operation is effected continuously in line in a rotagravure or flexographic printing machine (not shown). The lamination takes place at ambient temperature.

After lamination, the joined transfer agent and substrate is stored on the reel for a sufficient time to set the varnish and permit an easy release from the transfer agent. This, too, is best determined empirically and depends on the varnish, its thickness and the substrate. The transfer agent and substrate are stripped from one another on an unwinding machine as shown. The transfer agent may then be reused.

EXAMPLE 2

In this example, the transfer agent is metallized as in the previous example. Thereafter, the metallized face of the transfer agent is coated with a solvent free polyurethane type varnish. Unlike the previous example, in this case evaporation of the solvent is not required. After the varnish has been applied it is laminated to an 80 grams per square meter substrate. An in the previous example, the material is allowed to rest for a sufficient time to allow the varnish to set (e.g. 24 hours) and then the transfer agent and substrate are separated.

EXAMPLE 3

Again, the transfer agent is metallized by a vacuum process. Thereafter, the metallized surface of the transfer agent is bonded to the surface of the substrate by means of an ultra violet radiation cross-linkable photopolymeric resin. The solvents are driven off by evaporation and the transfer agent is laminated to the substrate. In this example, the varnish may be applied either to the transfer agent or to the substrate since the results are the same. After lamination, the polymersizable agent is irradiated by the UV radiation through the transfer agent. This allows the resin to be set instantaneously and the substrate may be then stripped from the transfer agent in a continuous operation in the same machine. The resulting substrate has a highly polished specular metallized surface which is also heat resistant.

Although the present invention has been described in conjunction with preferred embodiments, it is to be understood that modification and variations may be resorted to without departing from the spirit and scope of the invention, as those skilled in the art will readily understand. Such modification and variations are considered to be within the purview and scope of the invention and the appended claims.

What is claimed is:

1. A process for the metallization of a substrate employing a reusable transfer agent comprising the steps of; depositing on the transfer agent a film of metal particles of the order of magnitude of substantially less than 1000 Angstroms in thickness; coating a portion of at least one of said substrate and said metallized transfer agent with varnish; laminating said substrate and said transfer agent together before said varnish is cured so that said metal particles are embedded in said varnish; curing said varnish; separating said transfer agent from said substrate, whereupon said substrate is provided with said film of metallic particles which film permits some light transmission, appears continuous and smooth and exhibits a specular metallic finish; and reusing said transfer agent in the metallization process.

2. The process as claimed in claim 1 wherein said metal particles minimally adhere to said transfer agent upon deposition thereon with an adherence less than the removal force of the cured varnish.

3. The process as claimed in claim 2 wherein the thickness of the deposited metal is less than 500 Angstroms.

4. The process claimed in claim 2 wherein the metal is aluminum and the thickness is between 50 and 250 Angstroms.

5. The process is claimed in claim 2 wherein at least one of said transfer agent and said substrate is flexible.

6. The process as claimed in claim 2 wherein at least one of said substrate and said transfer agent is an elongated web.

7. The process as claimed in claim 2 wherein said varnish is a polyurethane varnish.

8. The process as claimed in claim 2 wherein said varnish is an ultraviolet radiation cross-linkable resin.

9. The process as claimed in claim 2 wherein said transfer agent is a resin selected from the group consisting of polypropylene, polyethylene, polyester, polyvinylchloride, polyamide and regenerated cellulose.

10. The process as claimed in claim 2 wherein said varnish is coated in a particular design not covering the entire surface of said substrate.

11. The product formed by the process of claim 1.

12. The process as claimed in claim 1 wherein said metal particles are of metals selected from the group consisting of aluminum, silver, gold, copper, nickel, tin and platinum, and alloys of said metals.

13. A specular metallic coated article of manufacture comprising a substrate, a coating of cured varnish on at least a portion of said substrate, a metallic film in the form of particles embedded in said varnish, said film being on the order of magnitude of less than 1000 Angstroms in thickness such that said film permits some light transmission, appears continuous and smooth and exhibits a specular finish.

14. The article of manufacture as claimed in claim 13 wherein said film is selected from the group consisting of aluminum, silver, gold, copper, nickel, tin, platinum and alloys of said metals.

15. The article as claimed in claim 2 wherein said metal is aluminum of a thickness of 50 to 250 Angstroms.

16. The article as claimed in claim 12 wherein said substrate is selected from the group consisting of paper, cardboard, wood, leather and plastic.

17. The article as claimed in claim 12 wherein said coating of varnish is a coating of polyurethane varnish.

* * * * *

UNITED STATES PATENT AND TRADEMARK OFFICE
CERTIFICATE OF CORRECTION

PATENT NO. : 4,215,170
DATED : July 29, 1980
INVENTOR(S) : D. Enrique Vilaprinyo Oliva It is certified that error appears in the above—identified patent and that said Letters Patent is hereby corrected as shown below:

On the cover sheet, item (76) Inventor name should read:

-- D. Enrique vilaprinyo Oliva --.

Signed and Sealed this

Twenty-fifth Day of November 1980

[SEAL]

Attest:

SIDNEY A. DIAMOND

Attesting Officer

Commissioner of Patents and Trademarks